United States Patent [19]

Hazama et al.

[11] Patent Number: 4,764,235

[45] Date of Patent: Aug. 16, 1988

[54] PROCESS AND APPARATUS FOR SEALING SEMICONDUCTOR PACKAGES

[75] Inventors: Keiji Hazama, Oyama; Shin'ichi Ota; Mituo Yamada, both of Shimodate; Toshiyuki Arai, Tochigi, all of Japan

[73] Assignee: Hitachi Chemical Company, Ltd., Tokyo, Japan

[21] Appl. No.: 890,515

[22] Filed: Jul. 30, 1986

[30] Foreign Application Priority Data

Aug. 1, 1985 [JP] Japan ................................ 60-118722

[51] Int. Cl.[4] ........................ B32B 31/04; B32B 31/20
[52] U.S. Cl. .................................. 156/228; 156/272.2; 156/275.1; 156/292; 156/308.4; 156/309.6; 156/309.9; 156/379.8; 156/383; 156/556; 156/567; 156/580; 264/25; 264/248; 264/272.17; 414/744 R
[58] Field of Search ...................... 264/248, 272.17, 25; 156/228, 272.2, 272.4, 273.3, 273.5, 273.9, 274.2, 275.1, 292, 308.2, 308.4, 309.6, 309.9, 321, 379.6, 379.7, 379.8, 379.9, 383, 556, 566, 567–568, 580, 583.1; 414/744 R, 744 B

[56] References Cited

U.S. PATENT DOCUMENTS

| | | | |
|---|---|---|---|
| 4,056,881 | 11/1977 | Holt | 156/308.4 |
| 4,108,704 | 8/1978 | Horne | 156/273.9 |
| 4,119,481 | 10/1978 | Beckley | 156/324 |
| 4,305,897 | 12/1981 | Hazama | 156/308.4 |

FOREIGN PATENT DOCUMENTS 0181129  4/1982  Japan .

Primary Examiner—Merrell C. Cashion, Jr.
Attorney, Agent, or Firm—Antonelli, Terry & Wands

[57] ABSTRACT

An apparatus and method are described for sealing semiconductor packages made from a thermoplastic resin wherein a lead frame is positioned vertically at a center axis of the apparatus and a pair of mold parts having cavities for housing flat moldings are positioned symmetrically as to said center axis. With the described method and apparatus, sealed semiconductor packages with excellent sealing properties can be produced.

3 Claims, 3 Drawing Sheets

PROCESS AND APPARATUS FOR SEALING SEMICONDUCTOR PACKAGES

BACKGROUND OF THE INVENTION

This invention relates to a process and apparatus for sealing semiconductor packages made from a thermoplastic resin.

As resins for sealing semiconductor elements such as diodes, transistors, etc., or integrated circuits of these semiconductors (hereinafter referred to as a "semiconductive material"), there have been used epoxy series and silicone series thermosetting resins mainly. As molding methods for sealing with these resins, there have been used so-called transfer molding, casting, dipping and potting methods individually depending on objects for sealing. Among them, transfer molding using an epoxy resin is a typical method.

Plastic packages obtained by using plastics such as epoxy resins, etc., have a remarkable feature in that they can be produced in a lower cost due to collective seal molding of a number of lead frames mounting semiconductive materials compared with ceramic or metal packages by so-called hermetic seal using ceramics and metals. But since the thermosetting resins are used, there is a great defect in the molding steps. That is, it is necessary for several hours to carry out a postcure step in order to completely cure the thermosetting resin used for package after the seal molding. Therefore, it is difficult to combine smoothly intervals among individual steps and to automate the whole process comprising a dividing step of dividing semiconductor element built-in wafers into chip units, and a construction step including a die bonding step for fixing the chips on mounting portions of lead frames, a wire bonding step for connecting electrodes of chips to leads, a resin sealing step, a lead post-working step, and a marking step. In such a process, there is used a transfer molding apparatus having a structure in that a lead frame as a center axis is positioned horizontally for handling and transferring.

In order to solve the defects of the transfer molding mentioned above, Japanese patent unexamined publication No. 181129/82 proposes an apparatus for sealing semiconductor packages as shown in FIG. 4 wherein a lead frame positioned horizontally is taken as a center axis for handling and transferring as usual in the semiconductor industry, two flat moldings made from a thermoplastic resin previously molded are positioned at symmetrical places above and below, sealing surfaces of the flat moldings are melted by heating with hot-air heaters positioned symmetrically above and below, and a lead frame mounting a semiconductive material is sandwiched between the flat moldings and joined integrally under pressure. In FIG. 4, mold parts 3 and 3' for sealing individually have a cavity 5, 5' for receiving a flat molding, a cavity for preheating a sealing surface of flat molding, a cavity (not shown in the drawing) for heating the sealing surface of flat molding, and a cavity for integrally joining with a lead frame 1, and rotate around rotating shafts 8 and 8'. In FIG. 4, numerals 6 and 6' are hot-air heaters and 9 and 9' are hot-air preheaters.

This apparatus shows remarkably good sealing properties in sealing operation in a short time, but produces a fatal defect mentioned below in a long period sealing operation due to convection of hot-air since the hot-air heaters 6 and 6' and the hot-air preheaters 9 and 9' are positioned above and below. That is, the hot-air heater 6, the hot-air preheater 9 and the mold part 3 for sealing positioned at an above place show a tendency to be overheated by the convection phenomenon of hot-air. Further, since the upper and lower hot-air preheaters 9 and 9' have hot-air blow directions opposite to each other via the lead frame 1, it becomes difficult to control the heating conditions necessary for maintaining the sealing properties, i.e., the viscosity of molten resin of sealing surfaces of flat moldings, in a predetermined range. As a result, the sealing properties are damaged; this is a fatal defect. Further, considering the maintenance of the apparatus, since various parts of the apparatus are symmetrically positioned above and below of the center axis which is the lead frame 1 positioned in a horizontal attitude, the arrangement of parts particularly in the lower portion becomes very difficult, which results in constituting a hindrance to smooth maintenance and control of the apparatus.

SUMMARY OF THE INVENTION

It is an object of this invention to provide a process and an apparatus for sealing semiconductor packages necessary for maintaining fundamental essential conditions for semiconductor packages, i.e. sealing properties, in a continuous operation for a long period of time. It is another object of this invention to provide an apparatus for sealing semiconductor packages excellent in maintenance and control thereof.

This invention provides an apparatus for producing semiconductor packages by heating two flat moldings made from a thermoplastic resin individually in cavities of two mold parts for sealing, at least one of the flat moldings having a cavity for holding a body of semiconductive material, sandwiching a lead frame mounting the body of semiconductive material, and joining the flat moldings and the lead frame integrally under pressure, characterized in that a means for holding the lead frame in a vertical attitude is placed along a center axis of the apparatus, and the cavities in said mold parts are positioned symmetrically perpendicular to the lead frame and have openings at the same direction as the lead frame.

This invention further provides a process for producing a semiconductor package by heating two flat moldings made from a thermoplastic resin individually in cavities of two mold parts for sealing, at least one of the flat moldings having a cavity for holding a body of semiconductive material, sandwiching a lead frame mounting the body of semiconductive material with the flat moldings, and joining the flat moldings and the lead frame integrally under pressure, characterized by positioning the lead frame vertically while holding the two flat moldings horizontally individually in the cavities of two mold parts for sealing which mold parts are positioned symmetrically and on each side of the lead frame and able to rotate, heating the lead frame and the flat moldings, rotating the two mold parts so as to make the flat moldings sandwich the lead frame, followed by integral joining.

DESCRIPTION OF THE PREFERRED EMBODIMENTS

The apparatus of this invention is explained in detail referring to the accompanying drawings.

Figure 1:
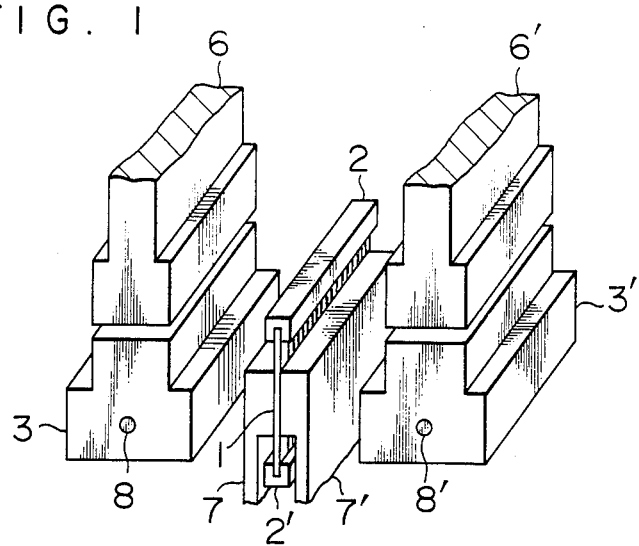
FIG. 1 is a perspective view of essential parts of the apparatus of this invention showing the apparatus performing a heating step.

FIG. 1 is a perspective view of essential parts of the apparatus of this invention, wherein lead frame holders 2 and 2' for holding a lead frame 1 positioned in a vertical attitude are placed in the center of the apparatus so as to locate the lead frame 1 along a center axis, and two mold parts 3 and 3' for sealing are positioned symmetrically with respect to the center axis.

The mold parts 3 and 3' have cavities 5 and 5' for housing a pair of flat moldings 4 and 4' made from a thermoplastic resin positioned horizontally i.e., the surfaces of the flat moldings to be sealed are arranged perpendicular to the lead frame.

Hot-air heaters 6 and 6' are positioned oppositely to the cavities 5 and 5' (not shown in FIG. 1) so as to melting sealing surfaces of the flat moldings 4 and 4' with heating. On the other hand, lead frame heaters 7 and 7' for heating the lead frame 1 are positioned symmetrically as to the lead frame 1 positioned vertically.

FIG. 1 shows a step of heating the flat moldings 4 and 4' by the hot-air heater 6 and 6' and the lead frame 1 by the lead frame heater 7 and 7'.

In FIG. 1, numerals 8 and 8' are rotating shafts.

Figure 2:
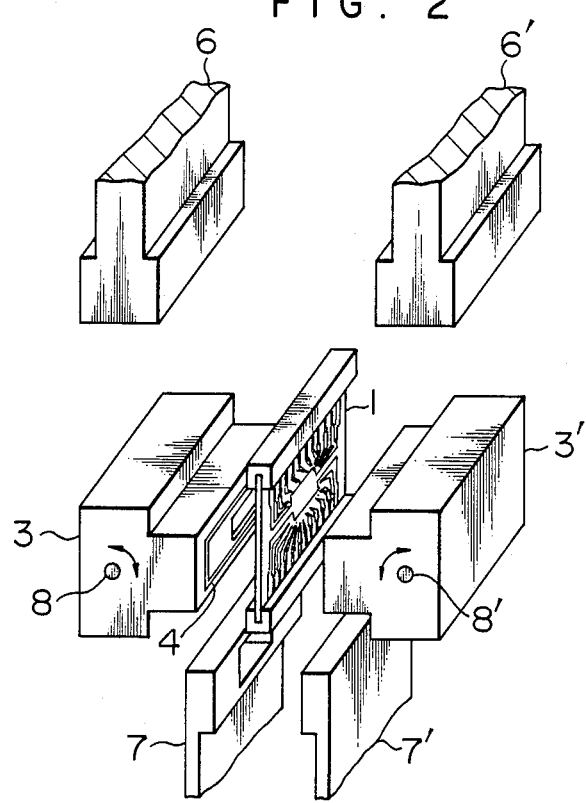
FIG. 2 is a perspective view of essential parts of the apparatus of this invention showing a state immediately before sealing and after the heating step.

FIG. 2 shows a step of sandwiching the lead frame 1 vertically positioned and heated, with a pair of the flat moldings 4 and 4', the sealing surfaces of which are melted with heating, immediately before a sealing step.

The whole process including the sealing step is explained referring to FIG. 3 as follows:

(a) The flat moldings 4 and 4' are set in the mold parts 3 and 3' and the lead frame 1 is set in the lead frame holders 2 and 2', respectively.

Figure 3:
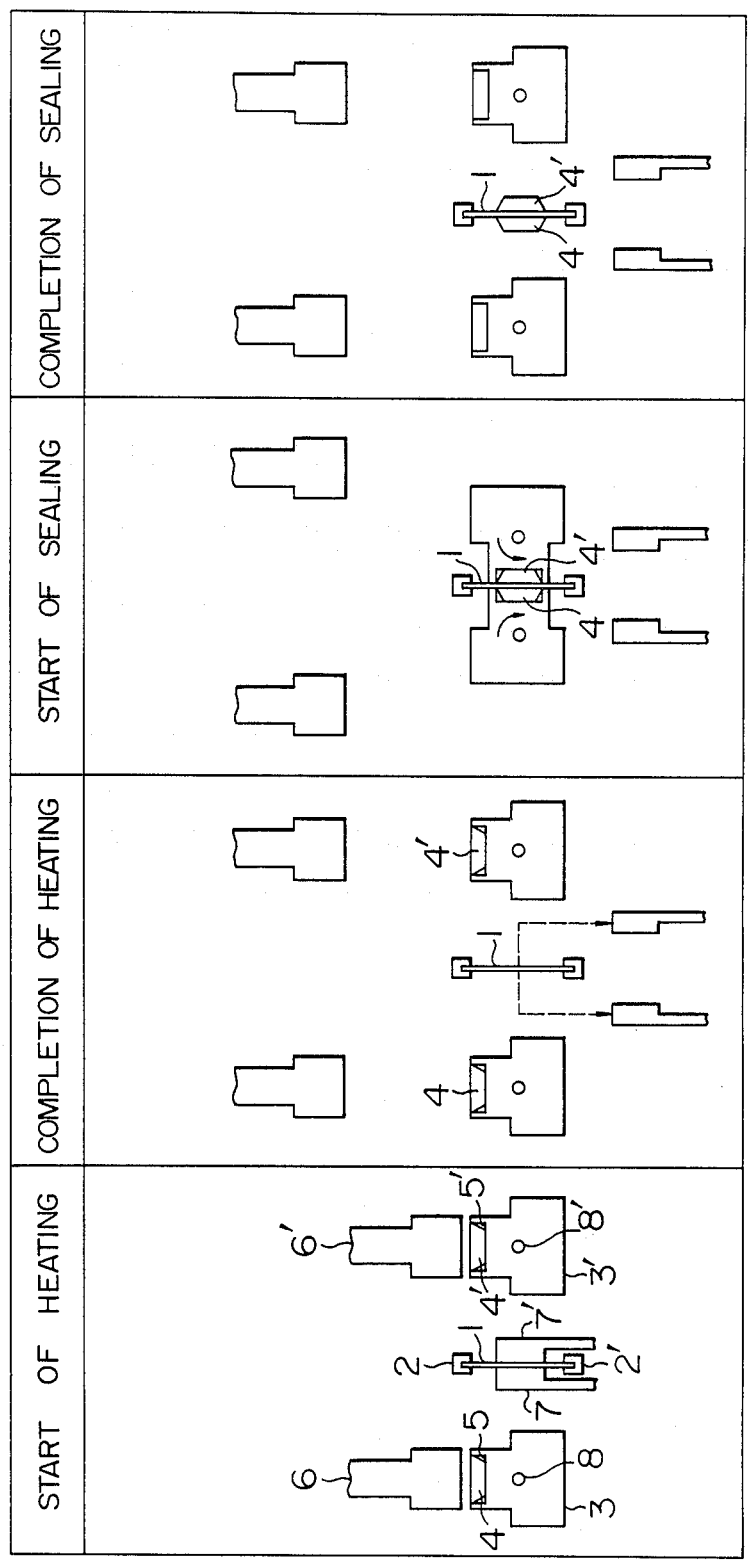
FIG. 3 shows a series of steps for sealing a semiconductor package by showing essential parts of the apparatus in cross-section.

(b) The lead frame heaters 7 and 7' are moved upward and positioned closely adjacent to the lead frame;

(c) The hot-air heaters 6 and 6' are moved downward so as to heat the sealing surfaces of the flat moldings 4 and 4', and at the same time the lead frame heaters 7 and 7' contact with the lead frame 1 to heat for a predetermined time (the state of start of heating shown in FIG. 3).

(d) The hot-air heaters 6 and 6' are moved upward and at the same time the lead frame heaters 7 and 7' are moved as shown by the dotted lines to complete the heating (the state of completion of heating shown in FIG. 3).

(e) The mold parts 3 and 3' rotate 90°.

(f) The heated lead frame 1 is sandwiched by a pair of flat moldings 4 and 4' having molten sealing surfaces and maintained for a predetermined time in this state (the state of start of sealing shown in FIG. 3).

(g) The mold parts 3 and 3' are separated.

(h) The mold parts 3 and 3' rotate 90° (the state of completion of sealing shown in FIG. 3).

In the above explanation, only one unit of parts is used for simplicity, but needless to say, the apparatus of this invention may include a plurality of units of parts for producing a number of sealed semiconductor packages at one time.

The heating means for the flat moldings made from a thermoplastic resin in a non-contact state is not limited to the hot-air heater, and any heaters which can soften and melt the sealing surfaces of flat moldings in a short time can be used.

The lead frame heater is not limited to a heating platen which heats in a contact state and any heating means which can heat in a non-contact state, for example heating by hot-air, radiant heating, and the like, can be used.

As the thermoplastic resin for forming the flat moldings, there can be used various kinds of thermoplastic resins depending on requirements for individual semiconductor packages. But the thermoplastic resins should have high thermal resistance (including resistance to heat distortion and resistance to thermal degradation), low moisture permeability and good electrical and mechanical properties as well as good moldability.

Typical examples of the thermoplastic resins are polyphenylene oxides, polyether sulfones, polysulfones, phenoxy resins, polyacetals, polyethylene terephthalates, polybutylene terephthalates, polyarylates, polycarbonates, polyamide resins having a low moisture absorption, polyphenylene sulfides, blends of these resins with one or more fillers such as glass fibers, etc.

According to the apparatus of this invention, since the cavities 5 and 5' in the mold parts 3 and 3' are positioned at the direction perpendicular to the lead frame and have openings at the same direction as the lead frame (as shown in FIG. 3, start of heating), a pair of flat moldings 4 and 4' housed in the cavities 5 and 5' can be heated and melted uniformly without causing positional unevenness by the hot-air heaters 6 and 6'.

Further since strong sealing can only be attained by uniform melting of the sealing surfaces of the flat moldings with heating, it is very important that the sealing surfaces of flat moldings 4 and 4' are positioned at the direction perpendicular to the lead frame and the openings of the cavities are directed at the same direction as the lead frame.

On the other hand, it is an essential factor for obtaining strong sealing properties with high reliability to sandwich the lead frame with a pair of sealing surfaces of flat moldings after heating the flat moldings and the lead frame to a predetermined state while maintaining the preferable heated state, followed by sealing under pressure. Such a factor can be satisfied by positioning the lead frame in a vertical attitude.

In the process shown in FIG. 3, the time from the completion of heating to the start of sealing, that is, the time required for the flat moldings to contact with the lead frame after the completion of heating, is preferable when it is as short as possible and 1 second at longest, in order to maintain strong sealing properties.

In order to attain the moving of the parts of the apparatus in a short time, it is preferable to make the distance of moving short and to employ rotational movement which can change the position in a short time. By positioning the lead frame in a vertical attitude, the shortest moving distance, that is, the movement in the shortest time, can be attained. This becomes an effective means for maintaining the high sealing reliability.

When the lead frame is positioned in a horizontal attitude and combined with the position of the mold parts for sealing as shown in FIG. 1, the sealing surfaces of a pair of flat moldings may be heated uniformly but the two mold parts for sealing should be moved quite differently with quite different moving distances in the following sealing step in order to sandwich the lead frame with a pair of sealing surfaces of flat moldings under pressure. This not only damages the smooth movements of the parts but also makes the shapes of the parts of apparatus complicate. Further, an idling time becomes necessary for either one of the mold parts for sealing in order to make the difference of the movements of two mold parts, that is, the difference in time necessary for the movements synchronous. As a result, the maintenance of the preferable heating state becomes difficult, and there is caused a fatal defect in that a strong sealing state cannot be attained.

This invention is illustrated by way of the following Examples.

EXAMPLE 1

A pair of flat moldings for packaging with 300 mil in width having a cavity for holding a body of semiconductive material were produced by injection molding using polyphenylene sulfide containing 40% by weight of glass fibers. After mounting semiconductor elements on a lead frame made of Alloy 42 (Fe 58 wt. %, Ni 42 wt. %), a built-up construction was formed by using gold wires according to a conventional process.

Using the apparatus shown in FIGS. 1 and 2, the sealing was carried out according to the steps shown in FIG. 3 under the following conditions:
Temperature of hot-air heater: 550° C.
Temperature of lead frame heater: 350° C.
Heating time of individual heaters: 4 sec
Sealing pressure of the mold parts: 35 kgf/cm$^2$ Sealing properties were evaluated by the Fluorocarbon Gross Leak method (MIL-STD-750C). All the 1000 samples were passed the test method.

When the sealing surfaces of a pair of flat moldings were melted with heating by the same hot-air heater under the same conditions as mentioned above and observed with the naked eye, these surfaces showed a uniformly molten state.

In this case, the time necessary for contacting the flat moldings with the lead frame after the completion of heating was 0.5 second.

COMPARATIVE EXAMPLE 1

The process of Example 1 was repeated except that the lead frame was positioned in a horizontal attitude in place of the vertical attitude, a pair of the flat moldings were positioned symmetrically as to the lead frame which is a center axis while placing each sealing surface facing to the lead frame, and hot-air supplying nozzles of the hot-air heater were directed to the sealing surfaces and hot-air was blown onto the sealing surfaces upward and downward for melting with heating.

The sealing properties were evaluated in the same method as in Example 1. 22 Samples among the 100 samples were bad (about 1/5 being bad).

When the sealing surfaces of flat moldings were melted with heating by the same hot-air heater under the same conditions as mentioned above and observed with the naked eye, these surfaces showed a non-uniform molten state.

COMPARATIVE EXAMPLE 2

Figure 4:
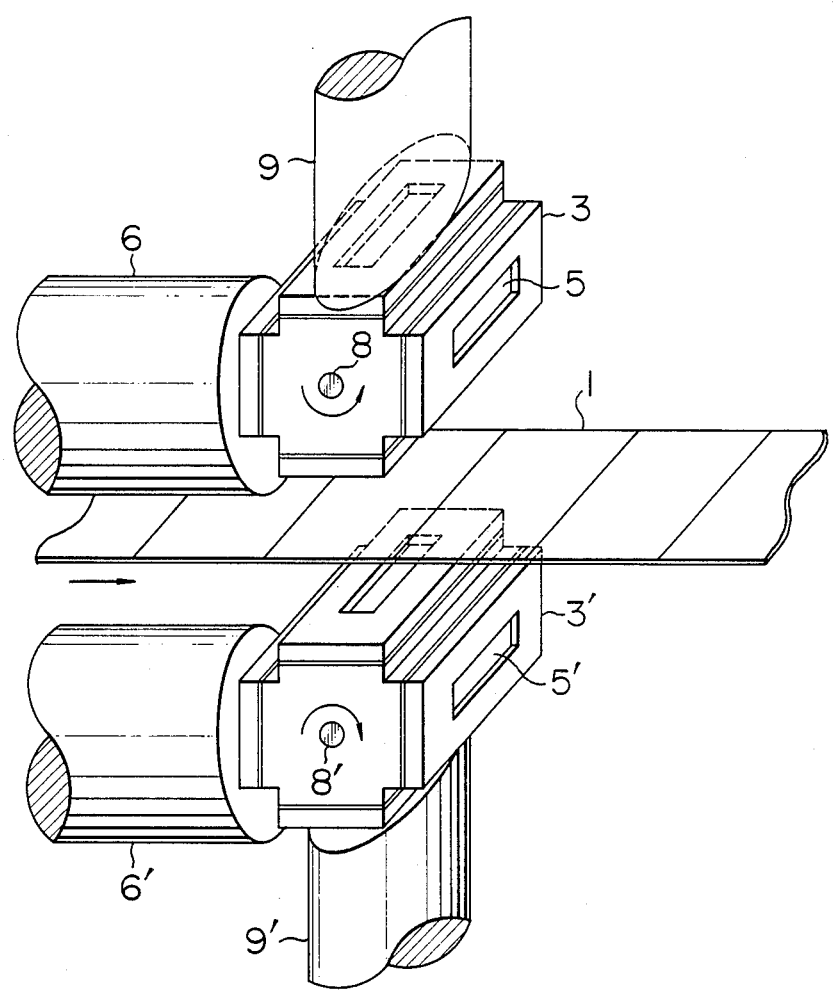
FIG. 4 is a perspective view of the prior art apparatus for sealing semiconductor packages.

Using the apparatus shown in FIG. 4, semiconductor packages were produced by using the same lead frames and flat moldings as used in Example 1. The flat moldings were preheated at 150° C. by using hot-air preheaters 9 and 9'. The sealing conditions were the same as those of Example 1.

As a result, 8 packages among 100 packages were bad in sealing properties. This number is better than that of Comparative Example 1 but worse than that of Example 1. Such a result seems to be derived from the use of hot-air preheaters positioned above and below as to the lead frame, said preheaters causing unevenness in viscosity of molten resins on the surfaces of flat moldings due to an influence caused by a convection.

According to this invention, since the cavities in the two mold parts for sealing are positioned in the same attitude and the flat moldings housed in the cavities are melted with heating under the same conditions, the melting state of sealing surfaces becomes uniform, which results in attaining sealing properties with strong and high reliability.

Further, by positioning the lead frame in a vertical attitude in the middle of two cavities in mold parts for sealing, the movements of individual parts necessary for integral sealing after heating the flat moldings by the hot-air heaters and heating the lead frame by the lead frame heaters can be accelerated to complete the sealing while maintaining the best heating conditions as long as possible, so that sealing properties with strong and high reliability can be attained.

What is claimed is:

1. A process for producing a semiconductor package comprising two flat moldings made from a thermoplastic resin, at least one of the flat moldings having a cavity for holding a body of a semiconductive material, and a lead frame, characterized by positioning the lead frame vertically while holding the two flat moldings in an initial horizontal position, said flat moldings being individually held in the cavities of two mold parts which are positioned symmetrically and adjacent to the lead frame and capable of being rotated through 90° from said initial position wherein the flat moldings have sealing surfaces directed upwardly and to another position wherein the sealing surfaces are directed towards the lead frame; heating the lead frame and the flat moldings in the initial position, thereafter rotating the mold parts through 90° and positioning the flat moldings against the lead frame and, pressing the flat moldings against the lead frame to join the flat moldings integrally to each other and to the lead frame.

2. An apparatus for producing semiconductor packages by sealing two flat moldings made from a thermoplastic resin around a semiconductor body mounted on a lead frame which comprises means for holding a lead frame on which a body of a semiconductor is mounted in a vertical position along a center axis of the apparatus; a pair of lead frame heaters for heating the lead frame, each of said lead frame heaters being movable vertically from an inoperable position spaced away from the lead frame to an operative position adjacent to the lead frame; a pair of mold parts positioned symmetrically with respect to the center axis and with respect to the lead frame, each mold part having a cavity for housing a flat molding made from a thermoplastic resin, each cavity being arranged in an initial position wherein the flat molding is arranged perpendicular to the lead frame with a sealing surface directed upwardly and being rotatable 90° to a second position wherein the flat molding is arranged parallel to the lead frame with its sealing surface directed towards the lead frame, said mold parts being movable laterally to place the flat moldings against the lead frame and thereby sandwich the lead frame between the flat moldings; and a pair of hot-air heaters for heating sealing surfaces of the flat moldings arranged in a horizontal position in the initial position of said mold parts, each of said hot-air heaters being able to be moved vertically towards and away from the mold parts containing the flat moldings; said hot-air heaters being moved upwardly away from the mold parts during rotation of the mold parts through 90°.

3. An apparatus for producing semiconductor packages according to claim 2 wherein said each mold part has a single cavity for housing the flat molding made from a thermoplastic resin.

* * * * *